United States Patent
Chang et al.

(10) Patent No.: US 6,775,810 B2
(45) Date of Patent: Aug. 10, 2004

(54) BOOSTING SIMULATION PERFORMANCE BY DYNAMICALLY CUSTOMIZING SEGMENTED OBJECT CODES BASED ON STIMULUS COVERAGE

(75) Inventors: Victor A. Chang, Mountain View, CA (US); William K. Lam, Newark, CA (US); Deepankar Bairagi, Davis, CA (US); Mohamed Soufi, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 112 days.

(21) Appl. No.: 10/266,429

(22) Filed: Oct. 8, 2002

(65) Prior Publication Data

US 2004/0068701 A1 Apr. 8, 2004

(51) Int. Cl.[7] ............................ G06F 17/50; G06F 9/45
(52) U.S. Cl. ........................................... 716/4; 717/138
(58) Field of Search ................................ 716/4; 717/138

(56) References Cited

U.S. PATENT DOCUMENTS 5,752,002 A * 5/1998 Naidu et al. .................. 703/14
6,463,582 B1 * 10/2002 Lethin et al. ................ 717/158
2002/0147969 A1 * 10/2002 Lethin et al. ................ 717/138

OTHER PUBLICATIONS

R. Helaihel et al., Java As A Specification Language for Hardware–Software Systems, 1997 IEEE/ACM International Conference on Computer–Aided Design, pp. 690–697, Nov. 1997.*

Jung Gyu Park et al., Specializing the Java Object Serialization Using Partial Evaluation For a Faster RMI, Proceedings of the 8th International Conference on Parallel and Distributed Systems, pp. 451–458, Jun. 2001.*

* cited by examiner

Primary Examiner—A. M. Thompson
(74) Attorney, Agent, or Firm—Osha & May L.L.P.

(57) ABSTRACT

A method for dynamically customizing object code for simulation includes obtaining a statically generated object (SGO) and a first test vector, segmenting the SGO with a marker node to generate a segmented SGO comprising a plurality of SGO segments, generating a first simulation profile using the segmented SGO and the first test vector, locating a first unexercised segment of the plurality of SGO segments using the first simulation profile, and generating a first reduced SGO by removing the first unexercised segment from the segmented SGO.

22 Claims, 6 Drawing Sheets

BOOSTING SIMULATION PERFORMANCE BY DYNAMICALLY CUSTOMIZING SEGMENTED OBJECT CODES BASED ON STIMULUS COVERAGE

BACKGROUND OF INVENTION

Modern high performance microprocessors have an ever-increasing number of circuit elements and an ever-rising clock frequency. Also, as the number of circuits that can be used in a CPU has increased, the number of parallel operations performed by the circuits has risen. Examples of efforts to create more parallel operations include increased pipeline depth and an increase in the number of functional units in super-scalar and very-long-instruction-word architectures. As CPU performance continues to increase, the result has been a larger number of circuits switching at faster rates. Thus, from a circuit design perspective, important considerations such as the time needed to complete a circuit simulation and the time needed to debug the CPU are taken into account.

As each new CPU design uses more circuits and circuit elements, each often operating at increased frequencies, the time required to simulate the circuit design increases. Due to the increased time for simulation, the number of tests, and consequently the test coverage, may decrease. In general, the result has been a dramatic increase in the logic errors that escape detection before the CPU is manufactured.

Circuit simulation may occur at a "switch-level." Switch-level simulations typically include active circuit elements (e.g., transistors) and passive circuit elements (e.g., resistors, capacitors, and inductors). Circuit simulation also may occur at a "behavioral level." Behavioral level simulations typically use a hardware description language (HDL) that determines the functionality of a single circuit element or group of circuit elements.

A typical behavioral level simulation language is "Verilog," which is an Institute of Electrical and Electronics Engineers standard. Verilog HDL uses a high-level programming language to describe the relationship between the input and output of one or more circuit elements. Verilog HDL describes on what conditions the outputs should be modified and what affect the inputs have. Verilog HDL programs may also be used for logic simulation at the "register transfer level" (RTL). RTL is a programming language used to describe a circuit design. The RTL programs written in Verilog go through a verification process. During this process, the Verilog design is parsed and checked for RTL style conformance by a style checker.

Using the Verilog HDL, for example, digital systems are described as a set of modules. Each module has a port interface, which defines the inputs and outputs for the module. The interface describes how the given module connects to other modules. Modules can represent elements of hardware ranging from simple gates to complete systems. Each module can be described as an interconnection of sub-modules, as a list of terminal elements, or a mixture of both. Terminal elements within a module can be described behaviorally, using traditional procedural programming language constructs such as "if" statements and assignments, and/or structurally as Verilog primitives. Verilog primitives include, for example, truth tables, Boolean gates, logic equation, pass transistors (switches), etc.

HDL simulations, written using HDL languages, may be event-driven or cycle-based. Event-driven simulators are designed to eliminate unnecessary gate simulations without introducing an unacceptable amount of additional testing. Event-driven simulators propagate a change in state from one set of circuit elements to another. Event-driven simulators may record relative timing information of the change in state so that timing and functional correctness may be verified. Event-driven simulators use event queues to order and schedule the events. Event-driven simulators process and settle all the active events in a time step before the simulator can move to the next time step.

Cycle-based simulators also simulate a change in state from one set of circuit elements to another; however, the state of an entire system is evaluated once each clock cycle. Cycle-based simulators are applicable to synchronous digital systems and may be used to verify the functional correctness of a digital design. Cycle-based simulators abstract away the timing details for all transactions that do not occur on a cycle boundary. Cycle-based simulators use algorithms that eliminate unnecessary calculations to achieve improved performance in verifying system functionality. Discrete component evaluations and re-evaluations are typically unnecessary upon the occurrence of every event.

Cycle-based simulators typically have enhanced performance. Depending on the particular options used, cycle-based simulators can offer five to ten times improvement in speed and one-fifth to one-third the memory utilization over conventional, event-driven simulators. Some cycle-based simulators also offer very fast compile times. For very large designs, the reduced memory requirements of cycle-based simulators allow a design team to simulate a design on almost every workstation on their network.

Figure 1:
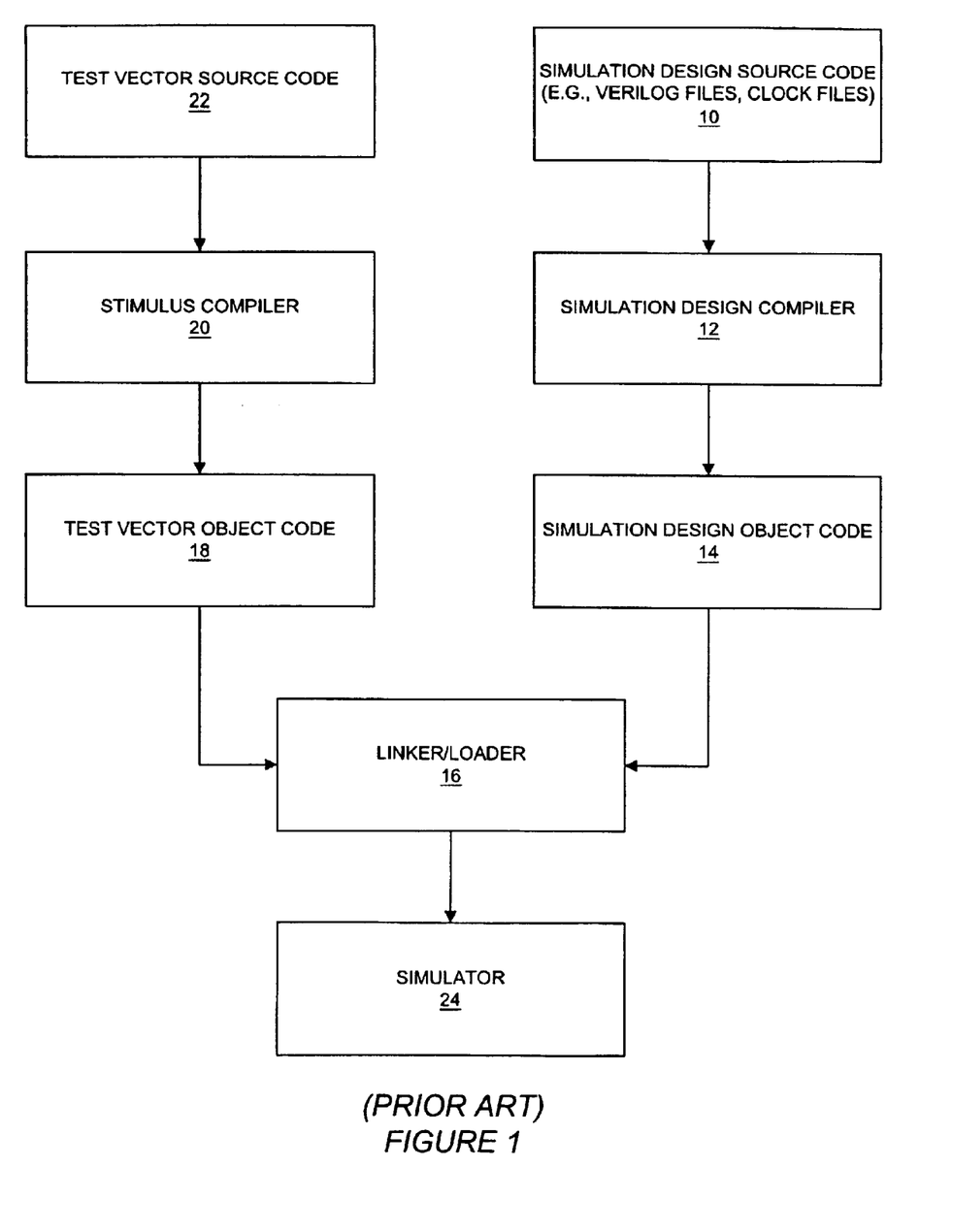
FIG. 1 illustrates a flow diagram of a typical simulation system.

A typical simulation system (e.g., cycle-based simulator) is shown in FIG. 1. A simulation design source code (10), which includes, for example, Verilog files, clock files, etc., is an input into a simulation design compiler (12). The simulation design compiler (12) statically generates simulation design object code (14). A linker/loader (16) takes as input the simulation design object code (14) and a test vector object code (18), which is output from a stimulus compiler (20). Test vector source code (22) is input into the stimulus compiler (20).

The test vector object code (18) provides stimulus in the form of input signal values for the simulation which is run on the simulator (24). For example, if a particular module included in the simulation design object code (14) includes an AND gate, the test vector object code (18) may provide stimulus in the form of a signal value equal to "1" to be sent to a pin of the AND gate at a particular time. The test vector object code (18) may also include expected outputs for signal values stimuli.

The test vector object code (18) may include multiple test vectors. For example, a collective test vector may include a first test vector to test a first group of modules of the simulation design object code (14), and a second test vector to test a second group of modules of the simulation design object code (14).

Using the test vector (18) and the simulation design object code (14), the linker/loader (16) generates and loads an executable code (i.e., an executable program) into the memory of simulator (24), where the simulation is performed. Depending on implementation, the simulator may use typical, "standard" computer architectures, such as may be found in a workstation, or may use other, "non-standard" computer architectures, such as computer architectures developed specifically for simulation or specifically for verification of circuit design.

However, regardless of whether simulator architecture is standard or non-standard, certain common issues are typically of concern to circuit testers and/or simulation designers. One issue is the size of the executable code in connection with cache performance.

Typically, a CPU is able to process information (e.g., executable code) faster than the information can be accessed and transferred from the main memory to the CPU. To reduce the amount of time the CPU remains idle, a fast but typically expensive type of memory is used as a cache. Access times for the cache are typically substantially faster than access times for the main memory.

When information requested is not found in the cache, a "cache miss" occurs. Conversely, if the information is found, there is a "cache hit." When a simulation is running on the simulator, as cache misses increase, simulation performance may be affected. As size of the executable code increases, often, simulation performance concerns may arise. For example, as less of the executable code can be stored and accessed from the faster cache, more of the code is stored and accessed in the slower main memory. Furthermore, longer completion times may be a concern with larger executable files.

SUMMARY OF INVENTION

In general, in one aspect, the invention relates to a method for dynamically customizing object code for simulation. The method comprises obtaining a statically generated object (SGO) and a first test vector, segmenting the SGO with a marker node to generate a segmented SGO comprising a plurality of SGO segments, generating a first simulation profile using the segmented SGO and the first test vector, locating a first unexercised segment of the plurality of SGO segments using the first simulation profile, and generating a first reduced SGO by removing the first unexercised segment from the segmented SGO.

In general, in one aspect, the invention relates to a system for dynamically customizing a statically generated object (SGO) for a simulation. The system comprises a first test vector for stimulating the SGO, a marker node segmenting the SGO to generate a segmented SGO, a first set of directives generated from a first simulation profile using the first test vector and the segmented SGO, and a first reduced SGO generated by removing a first unexercised segment of the segmented SGO using the first set of directives.

In general, in one aspect, the invention relates to a system for dynamically customizing a statically generated object (SGO) for a simulation. The system comprises a first test vector for stimulating the SGO, a marker node segmenting the SGO to generate a segmented SGO, a first set of directives generated from a first simulation profile using the first test vector and the segmented SGO, a first reduced SGO generated by removing a first unexercised segment of the segmented SGO using the first set of directives, and a linker/loader configured to use the first set of directives to remove the first unexercised segment.

In general, in one aspect, the invention relates to a computer system for dynamically customizing object code for simulation. The computer system comprises a processor, a memory, and software instructions stored in the memory for enabling the computer system under control of the processor, to perform obtaining a statically generated object (SGO) and a test vector, segmenting the SGO with a marker node to generate a segmented SGO comprising a plurality of SGO segments, generating a simulation profile using the segmented SGO and the test vector, locating an unexercised segment of the plurality of SGO segments using the simulation profile, and generating a reduced SGO by removing the unexercised segment from the segmented SGO.

In general, in one aspect, the invention relates to an apparatus for dynamically customizing object code for simulation. The apparatus comprises means for obtaining a statically generated object (SGO) and a test vector, means for segmenting the SGO with a marker node to generate a segmented SGO comprising a plurality of SGO segments, means for generating a simulation profile using the segmented SGO and the test vector, means for locating an unexercised segment of the plurality of SGO segments using the simulation profile and means for generating a reduced SGO by removing the unexercised segment from the segmented SGO.

Other aspects and advantages of the invention will be apparent from the following description and the appended claims.

DETAILED DESCRIPTION

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 2:
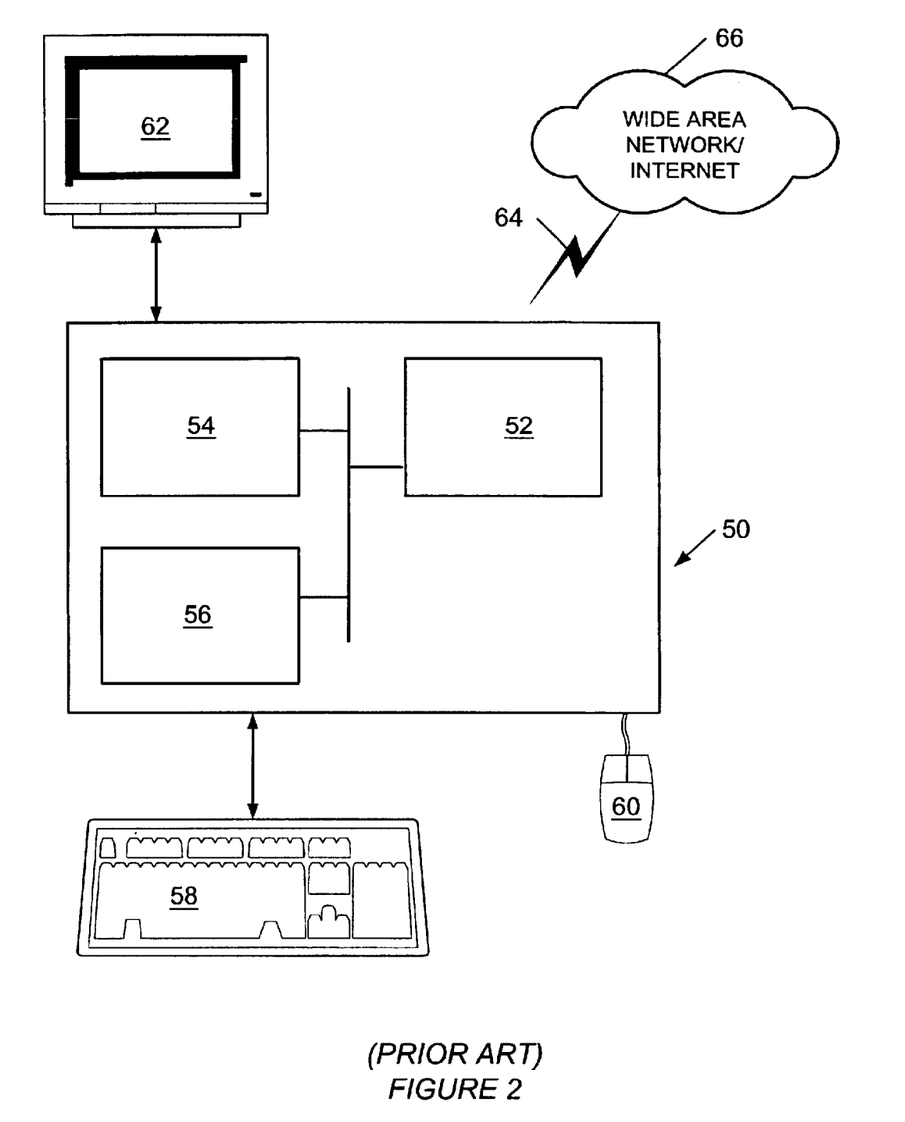
FIG. 2 illustrates a typical networked computer system.

The invention may be implemented on virtually any type computer regardless of the platform being used. For example, as shown in FIG. 2, a typical computer (50) includes a processor (52), memory (54), a storage device (56), and numerous other elements and functionalities typical of today's computers (not shown). The computer (50) may also include input means, such as a keyboard (58) and a mouse (60), and an output device, such as a monitor (62). Those skilled in the art will appreciate that these input and output means may take other forms in an accessible environment. The computer (50) may be connected via a network connection (64) to a Wide Area Network (WAN) (66), such as the Internet.

Figure 3:
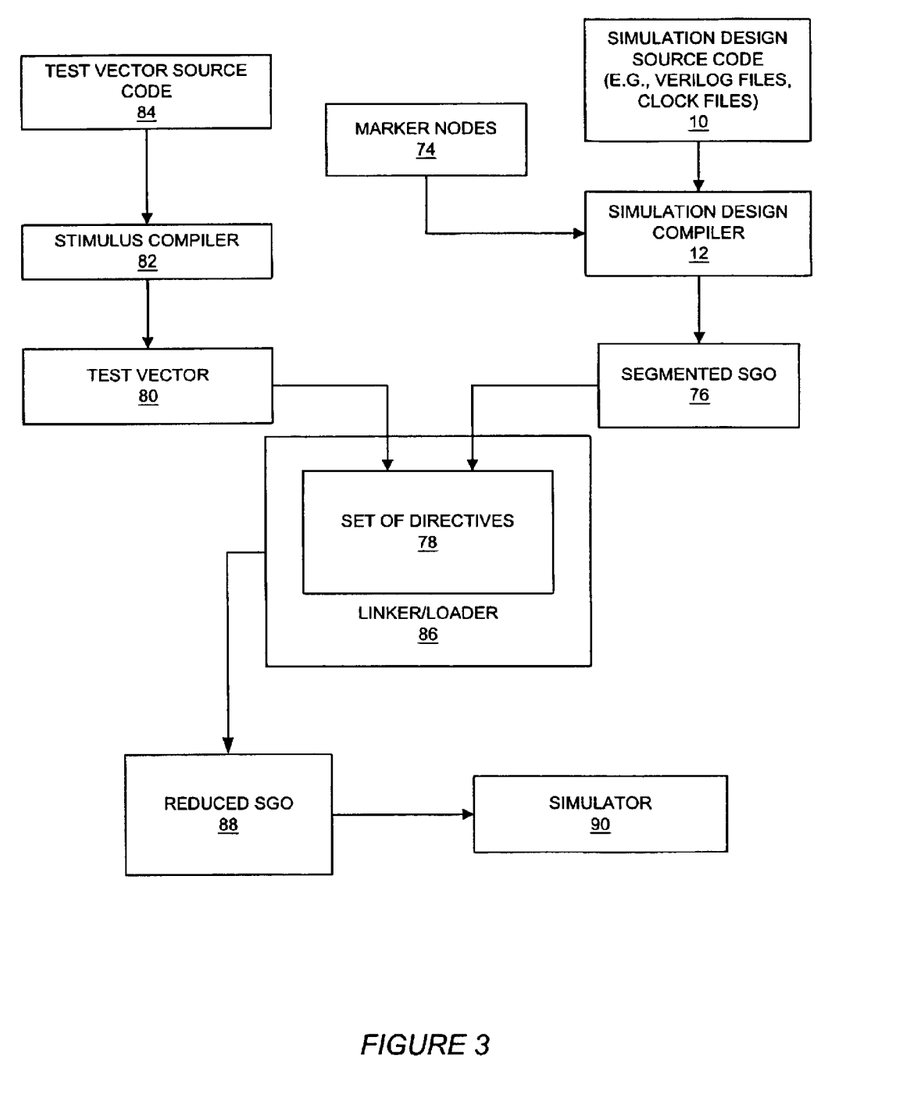
FIG. 3 illustrates a flow diagram showing entities used in a simulation system, in accordance with one or more embodiments of the invention.

In order to address performance issues associated with the size of executable code loaded onto a simulation system, entities used in a simulation system as shown in FIG. 3 may be used to reduce the size of the executable code by dynamically customizing a segmented Statically Generated Object (SGO). A simulation design compiler (12) takes input from simulation design source code (10), where the simulation design source code (10) may include items such as HDL files (e.g., Verilog files, clock files, etc.). The simulation design compiler (12) also takes input from a set of marker nodes (74) used to label components of the simulation design source code (10). The components of the simulation design source code (10), in accordance with one or more embodiments of the invention, are modules, groups of modules, or circuit elements (e.g., AND gates, OR gates, etc.). The output of the simulation design compiler (12) is a segmented SGO (76), which may include one or more segments of object code, delineated and labeled by marker nodes inserted into the segmented SGO (76) in accordance with one embodiment of the invention. Each segment of object code of the segmented SGO (76) is a contiguous block of object code representing a component. Optimization manipulations of object code and/or instructions by a compiler (e.g., instruction scheduling) are well known to those skilled in the art. In accordance with one embodiment of the invention, no optimization manipulations are performed across different blocks of object code, and no instruction scheduling is performed within or between contiguous blocks of object code.

A set of directives (78) is applied to the segmented SGO (76) during the linking/loading phase of the simulation compilation. A set of directives (78) has as an input a test vector (80), which is object code output from a stimulus compiler (82), which has as an input a test vector source code (84). The set of directives (78) used by the linker/loader (86) produces as output a reduced SGO (88), which is loaded as executable code onto a simulator (90).

Figure 4:
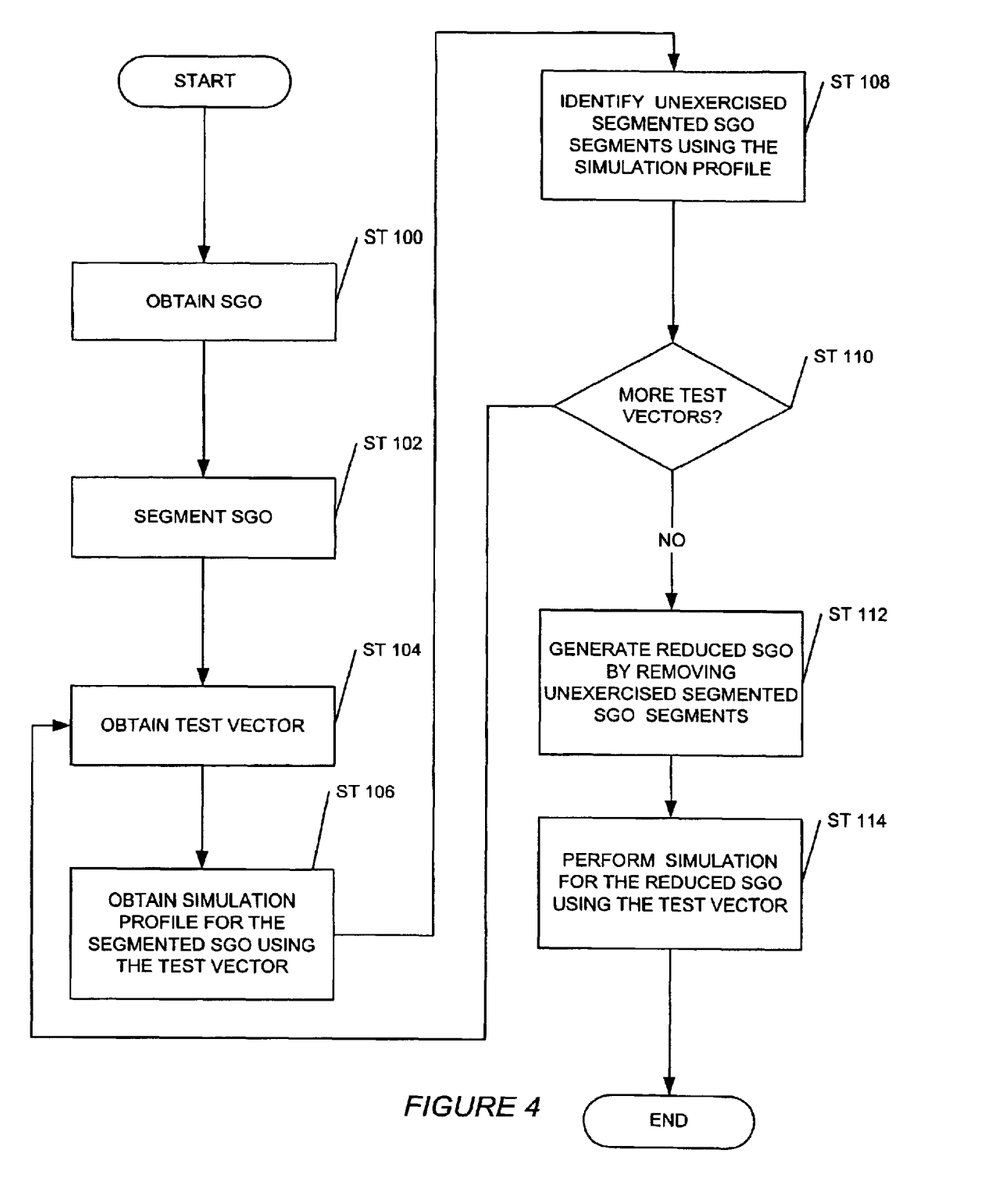
FIG. 4 illustrates a sequence of operations to reduce a size of an executable code loaded onto a simulator, in accordance with one or more embodiments of the invention.

A sequence of operations for reducing the size of the executable code loaded onto the simulator is shown in FIG. 4. First, the SGO is obtained (Step 100). The SGO may be obtained by, for example, creating simulation design source code files (written in Verilog, for example, with appropriate clock files, etc., included), and compiling the simulation design source code files. Once the SGO is obtained, the SGO is segmented (Step 102). The SGO may be segmented by, for example, labeling components of the SGO using marker nodes. For example, a component may represent a Verilog module, and a marker node may be used to label a boundary of a particular contiguous segment of SGO object code with a given name, thus identifying a contiguous segment that represents the component.

Figure 5:
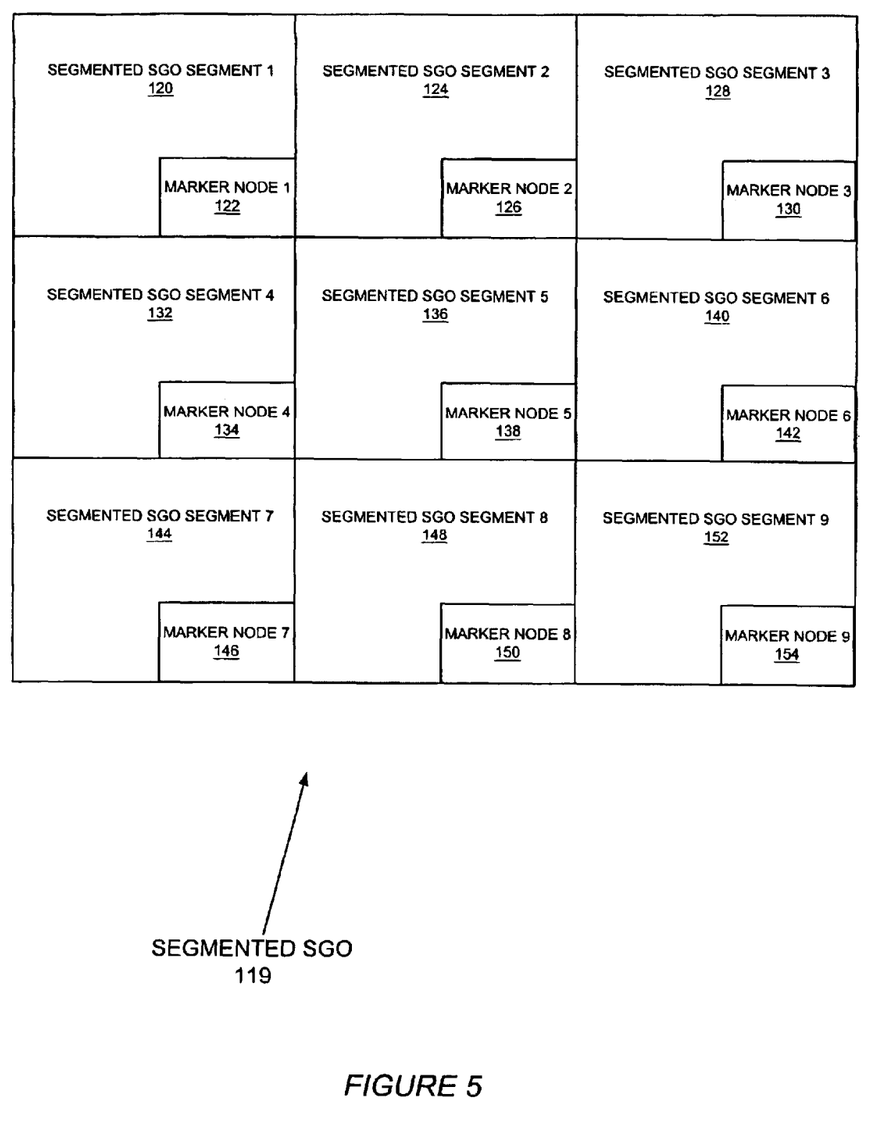
FIG. 5 illustrates a segmented Statically Generated Object (SGO), in accordance with one or more embodiments of the invention.

FIG. 5 shows a segmented SGO (119) in accordance with one embodiment of the invention. The segmented SGO (119) includes segmented SGO segment 1 (120), and marker node 1 (122), where marker node 1 (122) marks a boundary between segmented SGO segment 1 (120) and segmented SGO segment 2 (124). Likewise, marker node 2 (126) marks a boundary between segmented SGO segment 2 (124) and segmented SGO segment 3 (128). Segmented SGO segment 4 (132) through segmented SGO segment 9 (152) and marker node 3 (130) through marker node 9 (154) function similarly.

Segments of the segmented SGO generated may have differing granularities. For example, for one embodiment of the invention, a segment of the segmented SGO may represent a circuit element, such as an AND gate. However, for another embodiment of the invention, a segment of the segmented SGO may represent one or more modules, e.g., Verilog modules.

Referring back to FIG. 4, in order to provide stimulus for the simulation, a test vector is obtained (Step 104). For example, the test vector may be obtained by writing test vector source code and compiling the test vector source code using the stimulus compiler. In accordance with one embodiment of the invention, a collective test vector that includes multiple test vectors may be used for the simulation. A particular test vector may be designed so as to stimulate a particular portion of the segmented SGO. For example, a first vector may be designed to send a first signal pulse to a particular AND gate at a first time period (e.g., a first clock cycle). A second test vector may be designed to send a second signal pulse to a particular OR gate at a second time period (e.g., a second clock cycle).

A simulation profile for the segmented SGO using the test vector is obtained (Step 106). A profiling tool, such as one of the many profiling tools known to those skilled in the art, provides a display of expected runtime activity for computer software, in general, or for a simulation program, such as the segmented SGO, in particular. Typically, such profiling tools are able to provide information regarding which portions of the simulation program are exercised during simulation, and the duration each portion requires for execution, etc.

For example, the simulation profile may reveal that object code corresponding to a NOR gate is idle (unexercised) during a particular time period. Unexercised segments of the segmented SGO are identified using the simulation profile (Step 108). Because segments of the segmented SGO are labeled (using the marker nodes), a particular unexercised segment may be identified.

Those skilled in the art will appreciate that the test vector, in accordance with one embodiment of the present invention, may be included as part of a collective test vector that includes one or more test vectors. Therefore, a determination is made as to whether other test vectors are available for profiling the simulation (Step 110). If another test vector, e.g., the second test vector, is available for profiling the simulation, the next test vector is obtained (Step 104). Otherwise, any unexercised segments of the segmented SGO, and any associated marker nodes, are removed in order to generate the reduced SGO (Step 112). In accordance with one embodiment of the invention, the linker/loader uses a set of directives to remove the unexercised segments. For example, the set of directives may include a command to remove each unexercised segment. The set of directives is generated from the simulation profile.

Because each segment is identified by a node marker, and the profile simulation identifies which segments of the segmented SGO are unexercised, the set of directives may then identify to the linker/loader which segments of the segmented SGO to remove for any particular test vector. For example, for the previous example where the AND gate and the OR gate were exercised by the first test vector and the second test vector, the segmented SGO may also include other circuit elements, such as a NOR gate, which is not exercised by either the first test vector or the second test vector. Like the OR gate and the AND gate, the NOR gate is represented by a particular segment of the segmented SGO, with boundaries marked by a marker node. Thus, the segment representing the NOR gate is not included in the reduced SGO because the NOR gate was unexercised by the profile simulation.

Those skilled in the art will appreciate that because granularity of segmentation is adjustable, in accordance with one embodiment of the invention, instead of representing circuit elements (such as the NOR gate), segments of segmented SGO and the reduced SGO may represent modules, groups of modules, or other components of the SGO.

Removal of unexercised segments may involve rewriting of assembly level instructions and reassignment of resources at boundaries of components represented by unexercised segments. For example, a portion of the segmented SGO may represent a register. The register is included as part of a first segment of the segmented SGO, and the register performs a particular function, e.g., adds two numbers. However, the register may also perform functions for other segments of the segmented SGO. For example, the register may also perform addition for a second segment of the segmented SGO. Thus, a dependency is created because the second segment of the segmented SGO depends upon the register, which is included as part of the first segment of the segmented SGO. In accordance with one or more embodiments of the invention, such dependencies may require reassignment of resources. For example, if the first segment of the segmented SGO is removed because the first segment of the segmented SGO is unexercised, the register is relocated to the second segment of the segmented SGO.

Figure 6:
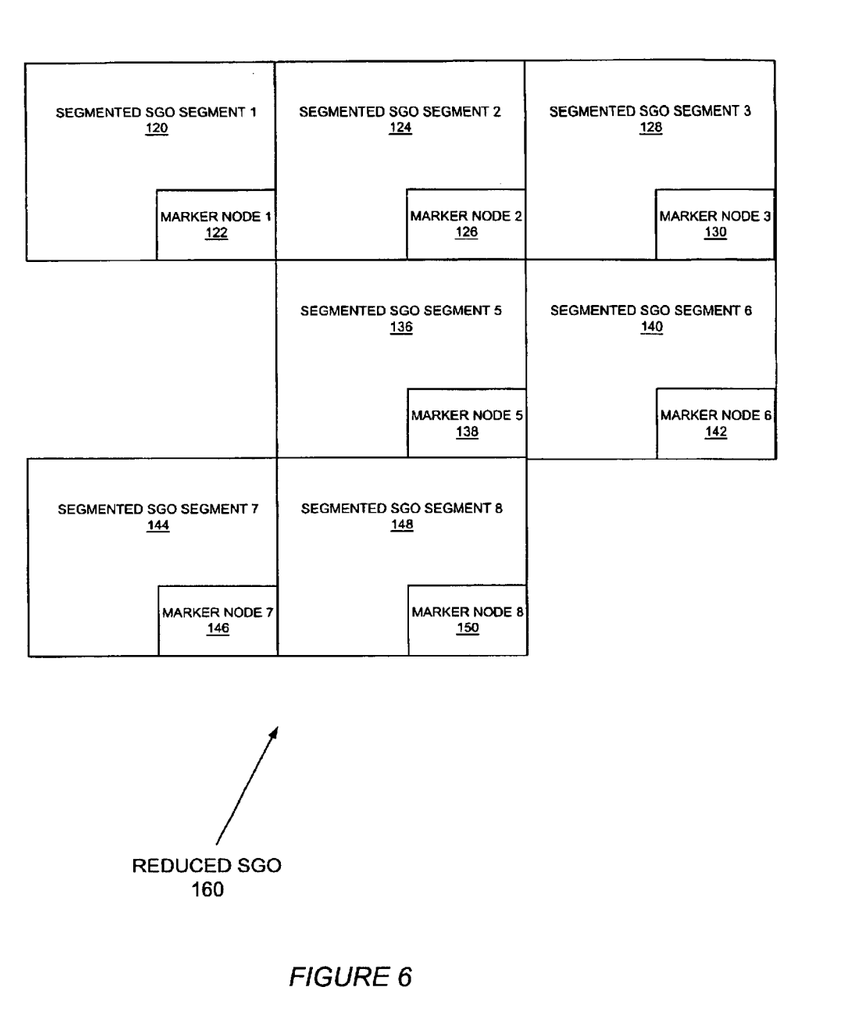
FIG. 6 illustrates a reduced segmented SGO, in accordance with one or more embodiments of the invention.

FIG. 6 shows a reduced SGO generated from the segmented SGO shown in FIG. 5 in accordance with one embodiment of the invention. Note that segmented SGO segment 4 (132 in FIG. 5) and segmented SGO segment 9 (152 in FIG. 5) have been removed from FIG. 6 as compared to FIG. 5. Both segments, being unexercised, were removed during generation of the reduced SGO (160).

Returning again to FIG. 4, once the reduced SGO is generated, the simulation may be performed on the simulator using the reduced SGO and the test vector (Step 114).

Advantages of one or more embodiments of the invention may include one or more of the following. In one or more embodiments, the invention provides for reduction of the size of the executable code (the reduced SGO) loaded onto a simulator, while maintaining accuracy because segments removed from the segmented SGO are unexercised for a particular test vector. Thus, simulation performance is improved by improving cache hit-miss ratio because removing unexercised segments of the segmented SGO leaves more room in the cache for exercised segments. Furthermore, because of the reduced SGO size, completion time for the simulation is reduced. Because the segmented SGO is dynamically customized (by removing unexercised components) for a particular test vector stimulus, the simulation design source code may therefore be compiled once, and afterwards for subsequent test vectors, the simulation design source code need not be recompiled. Thus, time-consuming recompilations of large simulation designs are avoided. Instead, the segmented SGO may be customized dynamically, i.e., "on the fly."

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for dynamically customizing object code for simulation, comprising:

obtaining a statically generated object (SGO) and a first test vector;

segmenting the SGO with a marker node to generate a segmented SGO comprising a plurality of SGO segments;

generating a first simulation profile using the segmented SGO and the first test vector;

locating a first unexercised segment of the plurality of SGO segments using the first simulation profile; and generating a first reduced SGO by removing the first unexercised segment from the segmented SGO.

2. The method of claim 1, further comprising:

performing a first simulation using the first test vector and the first reduced SGO.

3. The method of claim 1, further comprising:

obtaining a second test vector;

generating a second simulation profile using the segmented SGO and the second test vector;

locating a second unexercised segment of the plurality of SGO segments using the second simulation profile; and generating a second reduced SGO by removing the second unexercised segment from the segmented SGO.

4. The method of claim 3, further comprising:

performing a second simulation using the second test vector and the second reduced SGO.

5. The method of claim 1, wherein obtaining the first test vector comprises:

generating a test vector executable code; and compiling the test vector executable code to generate the first test vector.

6. The method of claim 1 wherein removing the first unexercised segment comprises:

generating a set of directives using the first simulation profile, wherein the set of directives comprises a command to remove the first unexercised segment; and writing an assembly-level instruction of the segmented SGO using the set of directives.

7. The method of claim 1, wherein generating the first reduced SGO further comprises reassigning a resource at a boundary of the first unexercised segment.

8. The method of claim 1, wherein segmenting the SGO comprises:

decomposing the SGO into a plurality of components, wherein each component of the plurality of components comprises a contiguous sequence of object code; and delineating each component of the plurality of components using the marker node.

9. The method of claim 8, wherein the marker node comprises a label.

10. The method of claim 8, wherein the component represents a module.

11. The method of claim 1, wherein segmenting the SGO is performed using an adjustable granularity.

12. A system for dynamically customizing a statically generated object (SGO) for a simulation, comprising:

a first test vector for stimulating the SGO;

a marker node segmenting the SGO to generate a segmented SGO;

a first set of directives generated from a first simulation profile using the first test vector and the segmented SGO; and a first reduced SGO generated by removing a first unexercised segment of the segmented SGO using the first set of directives.

13. The system of claim 12, further comprising:

a linker/loader configured to use the first set of directives to remove the first unexercised segment.

14. The system of claim 12, wherein the first unexercised segment comprises a contiguous block of object code representing a component.

15. The system of claim 14, wherein the component comprises a variable granularity.

16. The system of claim 12, further comprising:

a second test vector, wherein the second test vector and a second simulation profile are used to generate a second set of directives.

17. The system of claim 16, further comprising:

a second reduced SGO, wherein the second reduced SGO is generated by removing a second unexercised segment using the second set of directives.

18. A system for dynamically customizing a statically generated object (SGO) for a simulation, comprising:

a first test vector for stimulating the SGO;

a marker node segmenting the SGO to generate a segmented SGO;

a first set of directives generated from a first simulation profile using the first test vector and the segmented SGO;

a first reduced SGO generated by removing a first unexercised segment of the segmented SGO using the first set of directives; and a linker/loader configured to use the first set of directives to remove the first unexercised segment.

19. A computer system for dynamically customizing object code for simulation, comprising:

a processor;

a memory; and software instructions stored in the memory for enabling the computer system under control of the processor, to perform:

obtaining a statically generated object (SGO) and a test vector;

segmenting the SGO with a marker node to generate a segmented SGO comprising a plurality of SGO segments;

generating a simulation profile using the segmented SGO and the test vector;

locating an unexercised segment of the plurality of SGO segments using the simulation profile; and generating a reduced SGO by removing the unexercised segment from the segmented SGO.

20. The computer system of claim 19, further comprising software instructions to perform:

performing a simulation using the test vector and the reduced SGO.

21. An apparatus for dynamically customizing object code for simulation, comprising means for obtaining a statically generated object (SGO) and a test vector;

means for segmenting the SGO with a marker node to generate a segmented SGO comprising a plurality of SGO segments;

means for generating a simulation profile using the segmented SGO and the test vector;

means for locating an unexercised segment of the plurality of SGO segments using the simulation profile; and means for generating a reduced SGO by removing the unexercised segment from the segmented SGO.

22. The apparatus of claim 21, further comprising:

means for performing a simulation using the test vector and the reduced SGO.

* * * * *